United States Patent [19]

Elliott et al.

[11] Patent Number: 4,951,400

[45] Date of Patent: Aug. 28, 1990

[54] METHOD FOR PROCESSING PLASTIC PACKAGED ELECTRONIC DEVICES

[75] Inventors: Blaine K. Elliott, Columbia; Duane A. Briggs, Lexington, both of S.C.

[73] Assignee: NCR Corporation, Dayton, Ohio

[21] Appl. No.: 289,858

[22] Filed: Dec. 27, 1988

[51] Int. Cl.$^5$ .............................................. F26B 3/00
[52] U.S. Cl. ............................................ 34/15; 34/19
[58] Field of Search .................. 34/15, 19, 60, 61, 90, 34/92; 29/840

[56] References Cited

U.S. PATENT DOCUMENTS

| | | | |
|---|---|---|---|
| 3,815,251 | 6/1974 | Van Gelder | 34/5 |
| 4,239,485 | 12/1980 | Marshall | 432/121 |
| 4,612,710 | 9/1986 | Fernwood et al. | 34/16 |
| 4,777,520 | 10/1988 | Nambu et al. | 357/72 |

*Primary Examiner*—Harold Joyce
*Attorney, Agent, or Firm*—Wilbert Hawk, Jr.; Stephen F. Jewett; Douglas S. Foote

[57] ABSTRACT

The subject invention is a method for processing a plastic packaged electronic device with soldered leads. The solder has a critical temperature which if exceeded more than once results in its oxidation. The method comprises protecting the device with a carrier, and baking the device and carrier in a low pressure environment and at a temperature sufficiently high enough to drive off moisture previously absorbed by the plastic but lower than the critical temperature of the solder.

24 Claims, No Drawings

METHOD FOR PROCESSING PLASTIC PACKAGED ELECTRONIC DEVICES

The present invention relates to a method for processing plastic packaged electronic devices, and more particularly, to a method for removing moisture absorbed by such devices.

BACKGROUND OF THE INVENTION

The build-up of a printed circuit board for electronic and computer equipment entails the connection of electronic devices, sub-assemblies, and other such components to the board. A common means for building up printed circuit boards, sometimes referred to as "through-hole" technology, involves mounting components on one side of a board by inserting their leads through holes extending through the board. The components are affixed to the board by soldering the lead ends where they protude from the back side of the board. A conventional soldering technique is "wave soldering" where a printed circuit board with loosely held components is passed over a bath of molten solder. The lead ends are soldered as they are contacted by a wave of the molten solder.

An emerging technology for the build up of printed circuit boards is referred to as "surface mount" technology, and involves the mounting of components on both sides of a printed circuit board. Surface mount technology has one obvious advantage over through-hole technology in the greater number of components that can be mounted per board. However, the highly automated technique of wave soldering is unusable. Individual components may be mounted to the board surface by hand soldering. This is both time consuming and expensive. A preferred process for mass production involves heating the board and components. Both hot air and infrared (IR) radiation are used for such heating. For example, an IR reflow oven heats the various components, using infrared radiation, until the solder melts (about 218° C).

The relatively high temperature of the IR reflow oven presents some problems. Many of the electronic devices to be mounted on the board are so-called "plastic packaged devices". Plastic packaged devices are formed by encapsulating a semiconductor chip in a plastic package. These plastic packaged devices typically have a plurality of thin, gold bonding wires which connect the contacts of the chip with the external leads of the device. Both the chip and wire are encapsulated by the plastic with only the external leads extending from the device. The plastic, typically an epoxy resin, has the property of absoring moisture when subject to a hunid environment. When subjected to the high temperature of the IR reflow oven, any moisture in the plastic is rapidy vaporized. The vapor expansion may create small cracks which propagate through the plastic. These cracks appear as cosmetic flaws in the chip which can create later problems as water enters the crack, penetrates to the chip and corrodes the contacts. The cracks can also create a more immediate problem by breaking the thin bonding wires. This cracking problem is particularly acute in larger devices such as relatively high pin count chips. Sometimes the chip itself may have microscopic cracks in it caused by excessive pressure applied between the chip contact and bonding wires during manufacture (known as overbonding). These microscopic cracks may casue no harm. However, moisture may collect in the cracks and when rapidly vaporized during soldering crack the chip itself (known as chip-out).

The conventional way of avoiding the cracking problem is to bake the plastic packaged devices at a lower temperature (about 125° C. for 24 hours) prior to processing in the IR reflow oven. This allows the moisture to be vaporized more slowly permitting the vapor to released from the plastic without cracking the device. Several problems exist with this baking process. First, the external leads of an electronic device are normally dipped or coated with a tin/lead solder. The solder will not melt below about 183° C.; however, heating the solder above about 60° C. will start to oxidize the solder. The soldered leads can be heated above 60° C. one time prior to processing in the IR reflow oven. However, once so heated the solder cannot be reheated above 60° C. a second time prior to processing without the lead/tin solder oxidizing. Since oxidized leads render chips unusable, once a device is baked to drive off absorbed moisture it must be protected from further humidity until processed in the IR reflow oven. Devices that are not to be mounted for IR reflow oven processing within 96 hours are normally sealed in vapor tight bags with a desiccant. The cost of preventing the devices from reabsoring moisture after being baked is undesirable.

Another problem with the baking process involves the various types of protective carriers used to transport and store electronic devices. For example, plastic tubes are used to prevent mechanical damage to the device leads, various static shielding containers are used to prevent electrical damage to the device, and tape and reel configurations separate and orient smaller devices for automated assembly. In most cases, removing the devices from their carriers for the baking process defeats the purpose of the carrier, e.g., leads get bent, chips get blown with electrostatic charges and the organization of taped components is lost. However, in most cases 125° C. exceeds the critical temperature at which the carrier structure degrades, i.e., the temperature at which plastic tubes, static shields and plastic carrier tape melt or otherwise deteriorate. Thus, in order to bake devices to drive off moisture, they must be removed from their protective carriers which inevitably leads to additional part losses and other expenses. Conventional processing techniques, such as described above, have in the past resulted in losses as high as 42% for high pin count devices.

OBJECTS OF THE INVENTION

It is therefore an object of the present invention to provide a new and improved method for processing a plastic packaged electronic device.

It is another object of the present invention to provide a method for reducing heat-induced cracking of a plastic packaged electronic device.

It is s further object of the present invention to provide a method for heat treating a plastic packaged electronic device.

It is still another object of the present invention to provide a method for preventing mechanical and/or electrostatic damage to a plastic packaged electronic device such device is being heat treated.

It is yet a further object of the present invention to provide a method for baking a plastic packaged electronic device to drive off moisture absorbed by the device, which method can be repeated without breakdown of any part of the device.

SUMMARY OF THE INVENTION

The present invention is a method for processing a plastic packaged electronic device with soldered leads. The solder has a critical temperature which if exceeded more than once results in its oxidation. The method comprises baking the device in a low pressure environment and at a temperature sufficiently high enough to drive off moisture previously absorbed by the plastic but lower than the critical temperature of the solder.

According to another from of the invention, a method for processing a plastic packaged electronic device comprises protecting the device with a carrier, and baking the device and carrier to drive off any moisture absorbed by the plastic. The baking step further includes placing the device and carrier in an oven, depressurizing the oven, and heating the device to controllably drive off the moisture.

DESCRIPTION OF A PREFERRED EMBODIMENT

Semiconductor chips are relatively fragile and susceptible to environmental changes. In order to provide support for such chips, protect then from the environment, and provide support for electrical leads extending therefrom, it is known to encapsulate the chip in a plastic package such as an epoxy resin. Typically, thin gold wires, with a thickness on the order of 1 mil, are bonded at one end to contact regions on the chip. The other end of the gold wires are bonded to larger gauge metal leads which are the contact pins which provide the physical connections to circuit boards. The chip, gold wires, and part of the metal leads are encapsulated in a liquid epoxy resin, which when hardened protects and supports the semiconductor chip. The plastic packaged electronic device so formed has a plastic body with a plurality of leads or pins extending therefrom. The present invention is a method for processing a plastic packaged electronic device.

The device pins are well supported, and they can be worked without undue concern of disconnecting them from the chip. However, this is not to say that the pins can be bent with impunity. The process of encapsulating chips in the epoxy resin results in careful alignment of the contact pins. Particularly with high pin count devices this alignement is critical to assure accurate positioning with respect to bonding contacts on the printed circuit board. To avoid misalignment, the pins must be handled as little as possible from the time the devices are fabricated until installed on a circuit board. One method for protecting devices is to provide a carrier for transporting the device. A number of devices can be so protected by inserting them into a plastic tube. A typical tube can be closed at both ends to keep the devices from falling out. For relatively low pin count devices, particularly those which are going to be automatically positioned onto a circuit board by machine, a tape and reel carrier is more practical. A tape and reel carrier consists of a relatively long strip of tape with adhesive at regular intervals along the tape where the plastic body of the device is affixed. The tape and attached devices are rolled up onto a reel which can be later mounted onto a machine for automatically removing the devices and positioning them onto a circuit board. Although tape and reel carriers protect leads from being bent, an equally important function is to provide a means for efficient automatic handling of the device.

Each of the previously described carriers has a critical temperature at which its structure degrades. For plastic tubes the critical temperature is the temperature at which the plastic starts to melt, between 55° C. and 70° C. For plastic carrier tape, the critical temperature is the temperature at which the plastic plastic carrier starts to melt, between 55° C. and 70° C. The critical temperature for both types of carriers is much less than the melting point temperature of the plastic package, and also less than the 125° C. previously used to drive moisture out of the plastic packaged device.

Solder of course melts whem it reaches a certain temperature, typically 183° C. However, solder also has the property that it may be heated above about 60° C. but below 183° C. only once. Reheating solder above the lower threshold of 60° C. more than once results in its oxidation. Oxidation is a problem because the solder paste used to join the device to the printed circuit board must wick up the device lead. Wicking does not occur if the lead is oxidized. The lower threshold for the onset of oxdation (about 60° C.) is referred to herein as the critical temperature of solder. The critical temperature for solder is less than the melting point temperature of the plastic package, and also less than the 125° C. previously used to drive moisture out of the plastic packaged device.

The epoxy resin used for the plastic package has the property of absorbing mositure when exposed to a humid environment. For chips to be exposed to 218° C. heat of soldering, such as in an IR reflow oven, any absorbed moisture will vaporize too quickly and crack the device. The heretofore accepted method of pretreating devices by baking at 125° C. to drive off the moisture has its limitations. More specifically, this temeprature exceeds the critical temperature of solder and the critical temperature of most typical carrier materials. Thus, such baking can only be done one time prior to soldering and the devices must be first removed from their carriers.

According to the present invention, a mehtod is provided to bake the device with its carrier to controllably drive off moisture absorbed by the plastic package. The device and carrier are placed in an oven. If the device is inside a plastic tube, the cover at the end of the tube is first removed so that water vapor will be able to escape. There is no need to remove the device from the carrier, thereby reducing the risk of accidental damage to the pins. The oven is depressurized to less than atmospheric presure. Preferably the pressure is reduced to less than 35 torr, and in a preferred embodiment the pressure within the oven will be reduced to about 30 torr. The device is then heated and moisture driven off by raising the temperature within the oven. The oven temperature will be less than the critical temperature of solder and the critical temperature of the carrier but high enough to drive off moisture previously absorbed by the plastic. Preferably the device will be heated by raising the temperature within the oven to between 35° C. and 40° C. in a preferred embodiment to about 35° C. At 30 torr and 35° C., a device is baked about 12 to 24 hours to reduce the moisture content to an acceptable level. Generally this about 0.013% of the device or package weight.

After a device has been processed as described above, it can be subject to the much higher heat of the IR reflow oven with greatly reduced incidence of heat-induced cracking. If the device is not used a predetermined length of time, normally 96 hours if not sealed with a desiccant, it can be rebaked without solder oxidation or other damage.

It will be clear to those skilled in the art that the present invention is not limited to the specific embodiment disclosed and illustrated herein. Numerous modifications, variations, and full and partial equivalents can be undertaken without departing from the invention as limited only by the spirit and scope of the appended claims.

What is desired to be secured by Letters Patent of the United States is as follows.

What is claimed is:

1. A method for processing an electronic device packaged in plastic comprising:
   protecting said device with a carrier; and
   baking said device and carrier to controllably drive off moisture absorbed by said plastic.

2. The method of claim 1, wherein said baking step comprises:
   placing said device and carrier in an oven;
   depressurized said oven; and
   heating said device.

3. The method of claim 2, wherein said step of depresurizing said oven includes reducing the pressure within said oven to less than atmospheric pressure.

4. The method of claim 3, wherein said step of depressurizing said oven further includes reducing the pressure within said oven at less than 35 torr.

5. The method of claim 4, wherein said step of heating said device includes raising the temperature within said oven to between 35° C. and 40° C.

6. The method of claim 5, wherein said step of depressurizing said oven includes reducing the pressure within said oven to about 30 torr, and wherein said step of heating said device includes raising the temperature within said oven to about 35° C.

7. The method of claim 2, wherein said carrier has acritical temperature at which its structure degrades, said critical temperature being less than the melting point of said plastic package and wherein said heating step includes heating said device to a temperature less than the critical temperature of said carrier.

8. The method of claim 7, wherein said carrier indludes a tube and wherein said protecting step comprises inserting said device in said tube.

9. The method of claim 7, wherein said carrier includes a tape and wherein said protecting step comprises afixing said device to said tape.

10. The method of claim 7, wherein said plastic package electronic device has leads coated with solder, said solder having a critical temperature which if exceeded more than one results in its oxidation, and wherein said heating step includes heating said device to a temperature less than the critical temperature of said solder.

11. A method for processing an electronic device packaged in plastic having leads coated with solder, said solder having a critical temperature which if exceeded more than once results in its oxidation, said method comprising:
   baking said device in a low pressure environment and at a temperature sufficiently high enough to drive off moisture previously absorbed by said plastic but lower than the critical temperature of said solder.

12. The method of claim 11, wherein said pressure is less than atmospheric pressure.

13. The method of claim 12, wherein said pressure is less than 35 torr.

14. The method of claim 13, wherein said baking step includes heating said device to between 35° C. and 40° C.

15. The method of claim 14, wherein said pressure is about 30 torr, and said baking step includes heating said device to about 35° C.

16. A method for processing a plastic packaged electronic device having leads coated with solder, said solder having a critical temperature which if exceeded more than once results in its oxidation, said method comprising:
   protecting said device with a carrier;
   placing said device and carrier in an oven;
   depressurizing said oven; and
   heating said device to a temperature less than the critical temperature of said solder to controllably drive off moisture absorbed by said plastic.

17. The method of claim 16, wherein said carrier has a critical temperature at which its structure degrades, said critical temperature being less than the melting point of said plastic package and wherein said heating step includes heating said device to a temperature less than the critical temperature of said carrier.

18. The method of claim 17, wherein said step of depressurizing said oven includes reducing the pressure within said oven to less than atmospheric presure.

19. The method of claim 18, wherein said step of depressurizing said oven further includes reducing the pressure within said oven to less than 35 torr.

20. The method of claim 19, wherein said step of heating said device includes raising the temperature within oven to between 35° C. and 40° C.

21. The method of claim 20, wherein said step of depressurizing said oven includes reducing the pressure within said oven to about 30 torr; and wherein said step of heating said device includes raising the temperature within said oven to about 35° C.

22. The method of claim 21, wherein said carrier includes a tube and wherein said protecting step comprises inserting said device in said tube.

23. The method of claim 21, wherein said carrier includes a tape and wherein said protecting step comprises affixing said device to said tape.

24. A method for processing an electronic device packaged in plastic comprising:
   baking said device at less than atmospheric pressure to drive off moisture previously absorbed by said plastic.

* * * * *